United States Patent [19]

Olson

[11] Patent Number: 4,823,381

[45] Date of Patent: Apr. 18, 1989

[54] SECURITY COVER FOR TELEPHONE LINE INSTALLATION BACKBOARD AND METHOD OF RETROFITTING THE SAME

[76] Inventor: Robert D. Olson, 1301 N. Cheyenne, Tacoma, Wash. 98406

[21] Appl. No.: 910,002

[22] Filed: Sep. 22, 1986

[51] Int. Cl.$^4$ .................. H04M 1/00; H05K 7/14; H05K 7/18; H01R 13/44; H02B 1/02; H02G 3/08

[52] U.S. Cl. .................. 379/399; 174/66; 248/551; 361/346; 361/358; 361/428; 361/429; 379/397; 379/327; 439/133; 439/922

[58] Field of Search ............... 379/399, 397, 326–328, 379/330; 70/161; 174/66; 361/346, 356–362, 347, 428–429; 339/18 C, 36; 248/551–553; 439/922, 133, 135, 43

[56] References Cited

U.S. PATENT DOCUMENTS

| | | | |
|---|---|---|---|
| Re. 26,737 | 12/1969 | Jorgensen et al. | 361/361 |
| 1,355,887 | 10/1920 | Brown | 361/360 |
| 1,740,862 | 12/1924 | Hanny | 361/360 |
| 1,782,019 | 11/1930 | Wheeler | 361/359 |
| 1,825,000 | 9/1931 | Kessler et al. | 379/328 |
| 1,825,267 | 9/1931 | Frank et al. | 361/361 |
| 2,059,545 | 11/1936 | Borgmann | 379/330 |
| 3,468,429 | 9/1969 | Drake | 379/328 |
| 3,618,804 | 11/1971 | Krause | 174/66 |
| 3,808,509 | 4/1974 | Frazier | 174/66 |
| 4,158,754 | 6/1979 | Yonezaki et al. | 379/328 |
| 4,160,880 | 7/1979 | Brey | 379/328 |
| 4,213,013 | 7/1980 | Perna et al. | 379/328 |
| 4,516,818 | 5/1985 | Johnston et al. | 379/397 |
| 4,613,634 | 12/1986 | Raabe et al. | 361/361 |
| 4,658,418 | 4/1987 | Rodgers | 379/328 |
| 4,701,135 | 10/1987 | Volk et al. | 439/922 |

FOREIGN PATENT DOCUMENTS

| | | | |
|---|---|---|---|
| 725303 | 1/1966 | Canada | 361/346 |
| 2361794 | 4/1978 | France | 379/326 |
| 54-149842 | 11/1979 | Japan | 174/66 |
| 621139 | 4/1949 | United Kingdom | 379/328 |

Primary Examiner—Jin F. Ng
Assistant Examiner—Danita R. Byrd
Attorney, Agent, or Firm—Stetina and Brunda

[57] ABSTRACT

A security cover for a conventional telephone installation backboard, characterized by use of a pair of mounting members rapidly attachable to the backboard, one of which includes a hinged door panel which may be pivoted toward and away from the other mounting member to provide selective access to the backboard. The pair of mounting members are so constructed to permit mounting the backboard without disturbing any existing wiring connections on the backboard and once installed, the hinged door panel may be locked in a close position to prohibit unauthorized access to wiring disposed on the backboard.

14 Claims, 1 Drawing Sheet

SECURITY COVER FOR TELEPHONE LINE INSTALLATION BACKBOARD AND METHOD OF RETROFITTING THE SAME

BACKGROUND OF THE INVENTION

The present invention relates generally to telecommunication equipment and, more particularly, to a security cover for a telephone line installation backboard which prevents unauthorized access to telephone communication line terminals disposed on the backboard.

As is well known, telecommunication, i.e. telephone lines, are typically supplied throughout geographical areas through main telephone lines provided by authorized telephone utility companies which extend either above or below ground surface. Typically, such main telephone lines are branched or routed to individual structures and/or dwellings by way of distribution lines which extend from the main lines to a service entrance of the structure. The service entrance typically includes a mounting plate conventionally known as a backboard comprising a metal plate which is mounted to an electrically insulating supporting surface of the structure. The backplate mounts one or more wiring harness blocks for packages which include multiple pin terminals which facilitate individual pairs of telephone lines from the distribution line to be selectively connected or interfaced to corresponding pairs of lines routed through the structure and extending to individual telephone headset and/or communication stations.

Although such conventional prior art backboards have proved to be reliable and effective in their intended purpose, they possess inherent deficiencies which especially since divestiture of American Telephone and Telegraph, have detracted from their overall effectiveness in the trade.

Foremost of these deficiencies has been the inability of the prior art backboard systems to prevent unauthorized personnel from tampering with the telephone lines connected to the backboard. Although prior to divestiture, primarily only American Telephone and Telegraph personnel had access to such backboards, currently all private phone company personnel and, in many instances, the general public have free access to the backboards. Such unrestricted access often permits tampering with the phone lines during installation and/or repair of the phone line which oftentimes results in loss of telephone service to the structure.

Further, since typically all of the telephone line pairs of a structure are presented at the backboard, all lines may be easily monitored by unauthorized personnel at the backboard, thereby causing the backboard to be an extremely security vulnerable site for unauthorized monitoring and surveillance of telephone conversations and data transmissions.

Although these tampering and security deficiencies could be reduced by building a security vault about the backboard or disposing the backboards in a security room, such security vaults and rooms are extremely costly and further, in retrofit applications typically require the line connections to the backboard to be disturbed or removed from the backboard to facilitate remounting within the vault or room thereby resulting in temporary loss of communications to the structure.

Thus, there exists a substantial need in the art for a means for providing security to existing telephone backboards which is relatively low cost and permits rapid retrofitting of existing backboards without disturbing telephone line communications.

SUMMARY OF THE PRESENT INVENTION

The present invention specifically addresses and alleviates the above-referenced deficiencies associated in the art by providing a security cover for a conventional telephone line installation backboard characterized by use of a pair of elongate mounting members attachable to the backboard, one of which includes a hinged door panel which may be pivoted toward and away from the other mounting member to provide selective security access to the backboard. The pair of mounting members are so constructed to permit mounting to the backboard without disturbing any existing wiring connections thereon and once installed, the hinged door panel may be locked in a closed position to prohibit unauthorized access to the wiring packages disposed on the backboard, thereby eliminating tampering and/or monitoring of the telephone lines in the structure.

In the preferred embodiment, the pair of mounting brackets and hinged cover are sized to be proximal the size of the conventional backboard and may be mounted to the backboard by the same fasteners utilized to mount the backboard to a support surface. Further, once installed upon the backboard, the mounting members and hinged door panel cover the mounting screws of the backplate, thereby preventing the cover from being removed from the backplate.

The mounting members of the present invention preferably include large side cutouts or openings which permit existing wiring extending to and from the backboard to be maintained in place during and after installation of the security cover such that the same is not disturbed during installation and/or use of the present invention.

Thus, the present invention provides a low cost and rapid means to secure terminals and protect communications lines on a backboard.

DESCRIPTION OF THE DRAWINGS

These as well as other features of the present invention will become more apparent upon reference to the drawings wherein.

DETAILED DESCRIPTION OF THE PREFERRED EMBODIMENT

Figure 1:
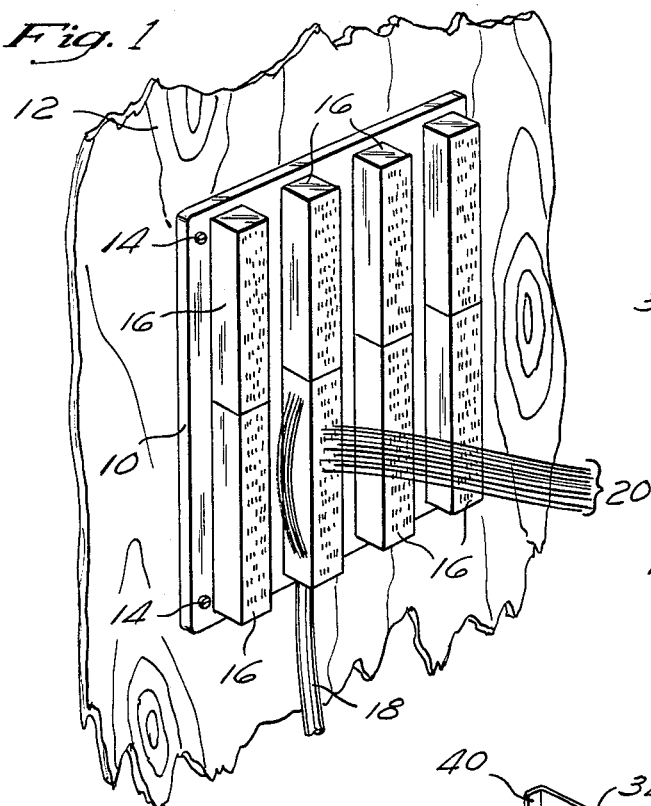
FIG. 1 is a perspective view of a conventional telephone line installation backboard having multiple wiring packages disposed thereon and interconnected to a distribution cable extending to the backboard and multiple line pairs extending to telephone and/or communication sites within a structure.

Referring to FIG. 1, there is shown a conventional prior art telephone backboard 10 which is mounted to a supporting surface 12 of a structure which typically comprises an electrically insulating material such as a sheet of plywood rigidly affixed to the wall of the structure. The backboard 10 is typically mounted to the support structure 12 by way of four threaded fasteners or screws 14 which extend through the backboard 10 and into the support structure 12. The backboard 10 mounts one or more wiring packages 16 which include multiple pin terminals illustrated schematically in FIG. 1. The pin terminals provide an interface between the main distribution line 18 provided by the utility phone company servicing the particular area of the structure with the line pairs 20 extending to desired locations within the structure wherein telephone headset or communication sites are desired.

Typically, the distribution line 18 comprises a Western Electric Company 32C cable while the wiring packages 16 comprise a Western Electric Company 66M1-50 wire harness. As is well known, the electrical connections between the distribution line 18 and line pairs 20 is facilitated by the manual insertion of jumper clips (not shown) upon the appropriate pin terminals of the wire packages 16. Although not by way of limitation but rather, of explanation, the backboard 10 typically comprises a Western Electric Company model number 183B1 backboard having dimensions of approximately 17 inch by 20 inch or 8 and ½ inch by 20 inch. Since all of the telephone pairs 20 extend to the wiring blocks 16 disposed upon the backboard 10, the backboard 10 provides a localized site wherein tampering and/or monitoring of the transmissions occurring upon the line pairs 20 may be easily facilitated. It is precisely this ease of tampering and monitoring at the site that the present invention is specifically designed to eliminate.

Figure 2:
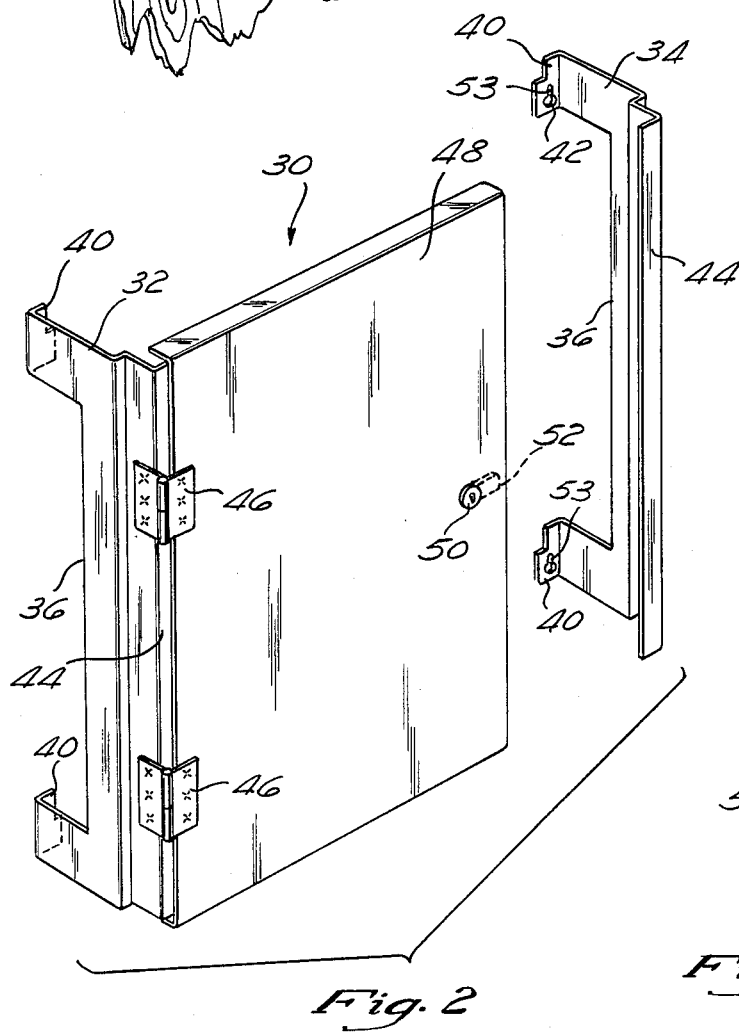
FIG. 2 is an enlarged perspective view depicting the security cover of the present invention.
Figure 3:
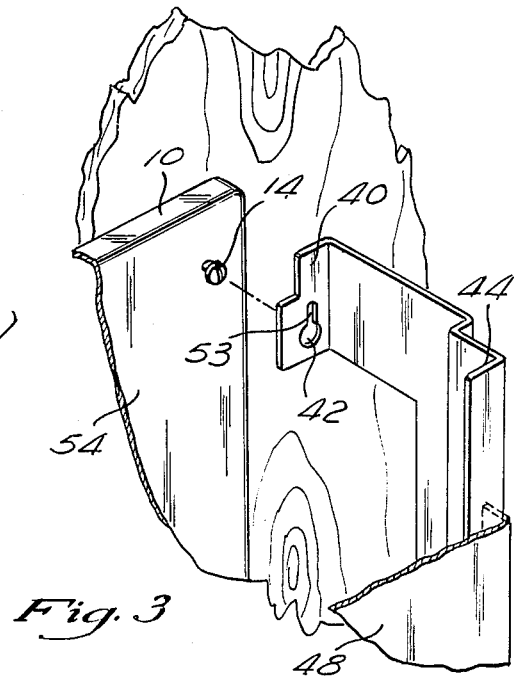
FIG. 3 is an enlarged partial perspective view of a portion of the security cover of the present invention and illustrating its manner of installation upon a backboard.

Referring to FIG. 2, the detailed construction of the security cover 30 of the present invention may be described. The security cover 30 is preferably formed by a pair of elongate mounting members 32 and 34 preferably formed of a rigid sheet metal material. The mounting members 32 and 34 are preferably sized to be approximately the same length as the length of the backboard 10 and have a height greater than the height dimension of the wiring packages 16 typically being approximately 4 through 6 inches. Each mounting member additionally is provided with an enlarged cutout or opening 36 which as will be explained in more detailed infra, permits existing wiring, i.e. the distribution line 18 and/or line pairs 20 to extend to and from the backboard 10. The inward edge portions of each of the mounting members 32 and 34 include a pair of mounting brackets 40 which extend laterally inward and are disposed in a plane generally perpendicular to the side walls of the mounting members 32 and 34. As best shown in FIGS. 2 and 3, the mounting brackets 40 are provided with a keyhole aperture 42 facilitated to install the mounting members 32 and 34 onto the backboard 10. The outermost edges of the mounting members 32 and 34 are provided with an L-shaped flange portion 44 which provides rigidity to the mounting members 32 and 34 to permit the same to have sufficient structural integrity for their desired purpose.

The mounting member 32 includes a pair of hinges 46 rigidly mounted adjacent the flange 44 which support a rectangular shaped cover panel 48 additionally preferably formed of a sheet metal material. The cover panel 48 is preferably sized to extend between the mounting members 32 and 34 when the security cover 30 is positioned upon the backboard 10 and is provided with a key lock 50 adjacent one end thereof which includes a rotatable latch 52 (indicated by the phantom lines in FIG. 2), sized to selectively extend beneath and cooperate with the L-shaped flange 44 of the mounting member 34 when positioned upon the backboard. As will be recognized, the door panel 48 is thereby hinged mounted to the mounting member 32 and may be selectively pivoted toward and away from the other mounting member 34 when desired.

With the structure defined, the installation and operation of the security cover 30 of the present invention may be described with specific reference to the installation of the same upon an existing backboard 10 having existing wiring connections at the wiring packages 16 between the distribution line 18 and line pairs 20. However, those skilled in the art will recognize that the security cover 30 of the present invention may additionally be installed and utilized upon a backboard 10 prior to wiring connections being made to the wiring packages 20 or, alternatively, be formed integral with a backboard 10 at time of manufacture.

Figure 4:
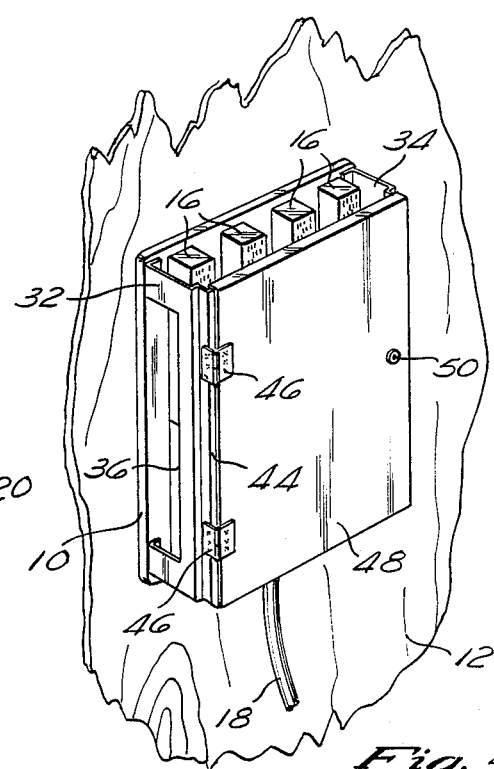
FIG. 4 is a perspective view of the security cover of the present invention installed upon the backboard of FIG. 1.

Referring particularly to FIGS. 3 and 4, initially the threaded fasteners 14 of the backboard 10 may be partially backed out or unscrewed through a short distance greater than the thickness of the mounting brackets 40 of the mounting members 32 and 34. By this partial backing out of the fasteners 14, it will be recognized that the backboard is still retained upon the supporting surface 12 and hence, that the wiring connections to the wiring packages are not disturbed. The mounting members 32 and 34 may then be positioned relative the backboard 10 and the head portions of the fasteners 14 may be inserted through the enlarged opening portion of the keyhole apertures 42 formed in each of the mounting brackets 40. Subsequently, each of the mounting members 32 may be reciprocated or slid downwardly relative the backboard 10 such that the enlarged head portion of the fasteners 14 extend into the smaller slot portion 52 of each keyhole aperture 42. The fasteners 14 may then be manually retightened to cause the brackets 40 to be abutted tightly against the front face 54 of the backplate 10 and the backplate 10 and mounting members 32 and 34 to be rigidly attached to the supporting surface 12.

The door panel 48 may then be pivoted about the hinges 46 between an open and closed position wherein in the closed position, the latch 52 of the lock 50 may be rotated to extend beneath the frontal portion of the L-shaped flange 44 of the mounting member 34 and maintain the same in a plane laterally spaced from and generally parallel to the plane of the backboard 10. As will be recognized, in this closed position (as indicated in FIG. 4), the door panel 48 extends over the wiring packages 16 and thereby prevents any tampering or monitoring of the same by unauthorized personnel. Alternatively, when it is desired to obtain access to the wiring packages 16 as during maintenance and/or addition of new telephone lines, authorized personnel may utilize a key (not shown) for the lock 50 to rotate the latch 52 into a vertical orientation (as viewed in FIG. 2) whereby the door panel 48 may be pivoted about the hinges 46 to allow free access to the wiring packages 16. As will be recognized, when the security cover 30 of the present invention is installed upon the backboard 10, all existing wiring to and from the wiring packages 16 may extend either through the rectangular cutouts 36 formed in the mounting members 32 and 34 or through the voids formed adjacent the top and bottom of the security cover 30.

Although in the preferred embodiment only a pair of mounting members 32 and 34 are utilized and are disposed in a vertical orientation upon the backplate 10, those skilled in the art will recognize that a top and bottom pair of mounting members may be utilized or alternatively, the mounting members 32 and 34 may be disposed in a horizontal position upon the backplate 10 without departing from the spirit of the present invention and such modifications are clearly contemplated herein.

What is claimed is:

1. A security cover device for attachment to a telephone line backboard, said backboard having a plurality of peripheral edges at least two of which are generally opposite one another and at least one telephone wire connected thereto with said telephone wire extending over at least one of said edges and said backboard being fixed to a support surface by one or more mounting fasteners, said security cover device comprising:
   a pair of mounting members sized and configured to extend along generally opposite edges of the backboard and to be attachable thereto so as to extend outwardly therefrom, at least one of said mounting members being provided with at least one cutaway region sized and configured to permit attachment of such mounting member along one of said opposite edges while the said telephone wires remain operatively connected to the backboard and extended over said edge;
   a cover panel movably attached to at least one of said mounting members; and
   means formed on said mounting members for fastening said pair of mounting members to the backboard, said cover panel sized to extend between said pair of mounting members and be disposed in a first closed position wherein said cover panel prevents access to the backboard and a second position wherein said cover panel allows access to the backboard.

2. The securing cover device of claim 1 further comprising a locking latch mounted to said cover panel selectively operable to cooperate with at least one of said mounting members to maintain said cover panel in said first closed position.

3. The security cover device of claim 2 wherein said fastening means comprises plural mounting brackets formed on said pair of mounting members formed to abut the backboard and be rigidly attached thereto.

4. The security cover device of claim 3 wherein said plural mounting brackets include a keyhole aperture sized to receive a fastener extending through the backboard.

5. The security cover device of claim 4 wherein said pair of mounting members are formed in an elongate configuration sized to extend substantially throughout the length of the backboard.

6. The security cover device of claim 5 wherein said pair of mounting members include a cut-out portion sized to allow wiring to extend to and from said backboard.

7. The security cover device of claim 6 wherein said cover panel is pivotally mounted to one of said mounting members.

8. The security cover device of claim 7 wherein said cover panel is formed of sheet metal.

9. The security cover device of claim 8 wherein said pair of mounting members are formed of sheet metal.

10. A method of providing a security cover to a telephone backboard having existing wiring connections and mounted on a support surface by fasteners, said method comprising the steps of:
    partially backing-out the fasteners mounting the telephone backboard to a support surface;
    positioning, adjacent opposite edges of said backboard, a pair of mounting members having cut-away regions therein so that portions of said mounting members extend beneath said fasteners and abut said backboard and said existing wiring connections extend through said cut-away regions;
    re-tightening said fasteners to mount said pair of mounting members to said backboard; and
    pivoting a cover panel to extend between said pair of mounting members, to prevent access to said backboard.

11. The method of claim 10 wherein said positioning step comprises the further steps of:
    aligning a keyhole aperture formed in said portion of said pair of mounting members with said fasteners;
    extending said fasteners through the enlarged portion of said keyhole apertures; and
    sliding said pair of mounting members relative said backboard such that said fasteners extend into the reduced portion of said keyhole apertures.

12. A security cover for attachment to a telephone backboard having telephone wires extending therefrom, said security cover comprising:
    a pair of mounting members attachable to said backboard, said mounting members being provided with cut-away regions sized and positioned to permit passage of said telephone wires therethrough such that said mounting members may be attached to said backboard without disturbing said telephone wires; and
    a cover member attached to said mounting members and extending generally over the frontal portion of said backboard;
    said cover member being positionable in a first closed position wherein access to said backboard is prevented and a second open position wherein access to said backboard is allowed.

13. The security cover of claim 12 wherein said mounting members are generally rectangular in shape and disposed so as to permit passage of said telephone wires in at least a lateral direction from said telephone backboard.

14. The security cover device of claim 1 wherein said security cover device is formed and configured to at least partially obscure and to deter removal of the backboard fasteners when said cover panel is in said first position.

* * * * *